United States Patent
Hong et al.

(10) Patent No.: US 10,198,184 B2
(45) Date of Patent: Feb. 5, 2019

(54) RESISTANCE VARIABLE MEMORY APPARATUS, AND CIRCUIT AND METHOD FOR OPERATING THEREFOR

(71) Applicant: SK hynix Inc., Icheon-si Gyeonggi-do (KR)

(72) Inventors: Do-Sun Hong, Icheon-si Gyeonggi-do (KR); Donggun Kim, Icheon-si Gyeonggi-do (KR); Yong Ju Kim, Icheon-si Gyeonggi-do (KR); Sang Gu Jo, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/434,784

(22) Filed: Feb. 16, 2017

(65) Prior Publication Data

US 2018/0081545 A1    Mar. 22, 2018

(30) Foreign Application Priority Data

Sep. 19, 2016 (KR) .................. 10-2016-0119511

(51) Int. Cl.
| | |
|---|---|
| *H03M 13/29* | (2006.01) |
| *G06F 3/06* | (2006.01) |
| *G06F 11/07* | (2006.01) |
| *G06F 12/02* | (2006.01) |
| *G11C 13/00* | (2006.01) |

(52) U.S. Cl.
CPC .......... *G06F 3/0604* (2013.01); *G06F 3/064* (2013.01); *G06F 3/0653* (2013.01); *G06F 3/0679* (2013.01); *G06F 11/073* (2013.01); *G06F 11/0751* (2013.01); *G06F 11/0793* (2013.01); *G06F 12/0246* (2013.01); *G11C 13/004* (2013.01); *G11C 13/0033* (2013.01); *G11C 13/0069* (2013.01); *G06F 2212/202* (2013.01); *G06F 2212/657* (2013.01)

(58) Field of Classification Search
CPC .................................................... H04L 1/0045
USPC ................... 714/746, 774, 764, 721
See application file for complete search history.

(56) References Cited

U.S. PATENT DOCUMENTS

| | | | |
|---|---|---|---|
| 8,271,855 B2* | 9/2012 | Norman | G11C 11/56 714/763 |
| 2010/0162037 A1* | 6/2010 | Maule | G06F 11/106 714/5.11 |

(Continued)

FOREIGN PATENT DOCUMENTS

| | | |
|---|---|---|
| KR | 1020140133800 A | 11/2014 |
| KR | 1020150095360 A | 8/2015 |

*Primary Examiner* — Fritz Alphonse
(74) *Attorney, Agent, or Firm* — William Park & Associates Ltd.

(57) ABSTRACT

A resistance variable memory apparatus may include a memory circuit configured to include a plurality of blocks, each including a plurality of memory cells. The resistance variable memory apparatus may include a disturbance preventing circuit configured to be driven based on a counting signal corresponding to the number of write access for each of the plurality of blocks, a write command, and an address signal and to allow scrubbing to be performed on a memory cell having a preset scrubbing condition when the counting signal satisfied with the scrubbing condition is output based on the scribing condition according to a physical position of the memory cell in the block.

18 Claims, 13 Drawing Sheets

(56) References Cited

U.S. PATENT DOCUMENTS

2015/0318033 A1* 11/2015 Kajigaya ................ G11C 29/52
                                                      714/764
2016/0253238 A1*  9/2016 Strauss ............... G06F 11/1072
                                                      714/721

* cited by examiner

FIG. 5A

MAT

BLK_P

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|
| 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
| 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 |
| 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 | 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 | 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 | 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 | 240 | 241 | 242 | 243 | 244 | 245 | 246 | 247 | 248 | 249 | 250 | 251 | 252 | 253 | 254 | 255 |

FIG. 5B

BLK_L

| 0 | 1 | 2 | 3 | 16 | 17 | 18 | 19 | 32 | 33 | 34 | 35 | 48 | 49 | 50 | 51 | 64 | 65 | 66 | 67 | 80 | 81 | 82 | 83 | 96 | 97 | 98 | 99 | 112 | 113 | 114 | 115 |
|---|---|---|---|---|---|---|---|---|---|---|---|---|---|---|---|---|---|---|---|---|---|---|---|---|---|---|---|---|---|---|---|
| 4 | 5 | 6 | 7 | 20 | 21 | 22 | 23 | 36 | 37 | 38 | 39 | 52 | 53 | 54 | 55 | 68 | 69 | 70 | 71 | 84 | 85 | 86 | 87 | 100 | 101 | 102 | 103 | 116 | 117 | 118 | 119 |
| 8 | 9 | 10 | 11 | 24 | 25 | 26 | 27 | 40 | 41 | 42 | 43 | 56 | 57 | 58 | 59 | 72 | 73 | 74 | 75 | 88 | 89 | 90 | 91 | 104 | 105 | 106 | 107 | 120 | 121 | 122 | 123 |
| 12 | 13 | 14 | 15 | 28 | 29 | 30 | 31 | 44 | 45 | 46 | 47 | 60 | 61 | 62 | 63 | 76 | 77 | 78 | 79 | 92 | 93 | 94 | 95 | 108 | 109 | 110 | 111 | 124 | 125 | 126 | 127 |
| 128 | 129 | 130 | 131 | 144 | 145 | 146 | 147 | 160 | 161 | 162 | 163 | 176 | 177 | 178 | 179 | 192 | 193 | 194 | 195 | 208 | 209 | 210 | 211 | 224 | 225 | 226 | 227 | 240 | 241 | 242 | 243 |
| 132 | 133 | 134 | 135 | 148 | 149 | 150 | 151 | 164 | 165 | 166 | 167 | 180 | 181 | 182 | 183 | 196 | 197 | 198 | 199 | 212 | 213 | 214 | 215 | 228 | 229 | 230 | 231 | 244 | 245 | 246 | 247 |
| 136 | 137 | 138 | 139 | 152 | 153 | 154 | 155 | 168 | 169 | 170 | 171 | 184 | 185 | 186 | 187 | 200 | 201 | 202 | 203 | 216 | 217 | 218 | 219 | 232 | 233 | 234 | 235 | 248 | 249 | 250 | 251 |
| 140 | 141 | 142 | 143 | 156 | 157 | 158 | 159 | 172 | 173 | 174 | 175 | 188 | 189 | 190 | 191 | 204 | 205 | 206 | 207 | 220 | 221 | 222 | 223 | 236 | 237 | 238 | 239 | 252 | 253 | 254 | 255 |

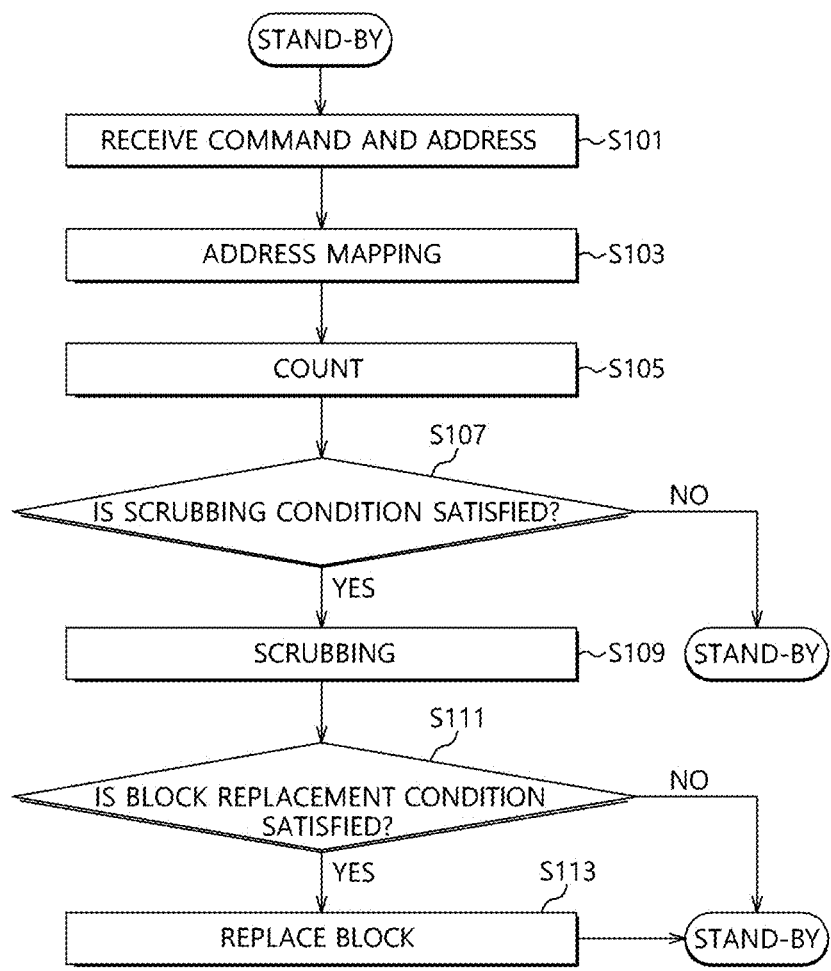

RESISTANCE VARIABLE MEMORY APPARATUS, AND CIRCUIT AND METHOD FOR OPERATING THEREFOR

CROSS-REFERENCES TO RELATED APPLICATION

The present application claims priority under 35 U.S.C. § 119(a) to Korean application number 10-2016-0119511, filed on Sep. 19, 2016, in the Korean Intellectual Property Office, which is incorporated herein by reference in its entirety.

BACKGROUND

1. Technical Field

Various embodiments may generally relate to a semiconductor integrated apparatus, and more particularly, to a resistance variable memory apparatus and circuit and method of operating the resistance variable memory apparatus.

2. Related Art

In general, resistance variable memory apparatuses may be next-generation memory apparatuses having advantages relating to low-costs, random access, high-speed operations, low power-consumption, and nonvolatility.

The resistance variable memory apparatuses may be a memory apparatus in which a data storage material layer is arranged between a pair of electrodes. The data is stored through change in a resistance state of the data storage material layer by an applied current or voltage.

A phase-change random access memory (PRAM) as the resistance variable memory apparatus may basically be configured of an access element and a data storage material layer configured of a phase-change material. When a preset voltage is applied between a word line and a bit line to write (program) data in the PRAM, a write current may be applied to the data storage material layer to change a resistance state of the data storage material layer.

The disturbance that the resistance state of the data storage material constituting the resistance variable memory apparatus is changed according to neighboring environment such as temperature, heat generated in a write operation, an elapse time after the write, and the like may be represented. Read/write margins may be reduced due to the disturbance, and thus the data retention time may be reduced.

In particular, the heat generated in the write operation of the memory cell of the PCRAM may affect neighboring memory cells and when the write operation is performed on one memory cell more than a present number of times, the soft error may occur due to changes in the resistance values of the neighboring memory cells.

SUMMARY

In an embodiment of the present disclosure, a resistance variable memory apparatus may be provided. The resistance variable memory apparatus may include a memory circuit configured to include a plurality of blocks, each including a plurality of memory cells. The resistance variable memory apparatus may include a disturbance preventing circuit configured to be driven based on a counting signal corresponding to the number of write access for each of the plurality of blocks, a write command, and an address signal and to allow scrubbing to be performed on a memory cell having a preset scrubbing condition when the counting signal satisfied with the scrubbing condition is output based on the scrubbing condition according to a physical position of the memory cell in the block.

In an embodiment of the present disclosure, a disturbance preventing circuit may be provided. The disturbance preventing circuit may include a memory circuit configured to include a plurality of blocks, each including a plurality of memory cells. The disturbance preventing circuit may include a threshold condition table configured to store a scrubbing condition according to a physical condition of the memory cell in the block. The disturbance preventing circuit may include a counter configured to output a counting signal corresponding to the number of write access for each of the plurality of blocks based on a write command and an address signal. The disturbance preventing circuit may include a determination circuit configured to allow scrubbing to be performed on the memory cell having a scrubbing condition when an output signal of the counter is satisfied with the scrubbing condition.

In an embodiment of the present disclosure, a method of a resistance variable memory apparatus including a memory circuit configured to include a plurality of blocks, each block including a plurality of memory cells, may be provided. The method may include setting a preset scrubbing condition according to a physical position of the memory cell in the block. The method may include outputting a counting signal corresponding to the number of write accesses for each of the plurality of blocks. The method may include performing scrubbing on a memory cell having the preset scrubbing condition when the counting signal which is satisfied with the corresponding preset scrubbing condition.

In an embodiment of the present disclosure, a method of operating a resistance variable memory apparatus may be provided. The method may include setting a preset scrubbing condition for a memory cell according to a physical position of the memory cell in a block. The preset scrubbing condition may be based on a number of write accesses for adjacent blocks and the block including the memory cell as well as a disturbance threshold of the memory cell. The method may include counting the number of write accesses for the adjacent blocks and the block including the memory cell to obtain a value. The method may include using the value to determine if the preset scrubbing condition is satisfied. The method may include scrubbing the memory cell if the preset scrubbing condition is satisfied.

BRIEF DESCRIPTION OF THE DRAWINGS

FIGS. 5A and 5B are diagrams illustrating a mapping relationship between a physical address and a logical address according to an embodiment of the present disclosure.

FIG. 6 is a flowchart illustrating a disturbance preventing method according to an embodiment of the present disclosure.

DETAILED DESCRIPTION

Various embodiments of the present disclosure will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present description as defined in the appended claims.

The present description is described herein with reference to cross-section and/or plan illustrations of idealized embodiments of the present description. However, embodiments of the present description should not be construed as limiting. Although a few embodiments of the present description will be illustrated and described, it will be appreciated by those of ordinary skill in the art that changes may be made in these embodiments without departing from the principles and spirit of the present disclosure.

Figure 1:
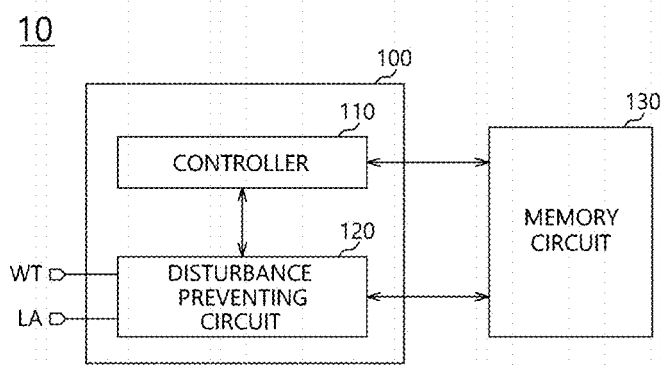
FIG. 1 is a configuration diagram illustrating a resistance variable memory apparatus according to an embodiment of the present disclosure.

FIG. 1 is a configuration diagram illustrating a resistance variable memory apparatus according to an embodiment.

Referring to FIG. 1, a resistance variable memory apparatus 10 according to an embodiment may include a controller 110, a disturbance preventing circuit 120, and a memory circuit 130.

The disturbance preventing circuit 120 may be provided inside the controller 110, and the controller 110 and the disturbance preventing circuit 120 may be integrally implemented as one controller 100.

The controller 110 may control data to be written in the memory circuit 130 in response to a write command WT input from the external apparatus or a host. The controller 110 may read data from the memory circuit 130 in response to a read command input from an external apparatus or the host.

Although not illustrated in drawings, the memory circuit 130 may include a memory cell array circuit and a peripheral circuit. The memory cell array circuit may be configured of a plurality of resistance variable memory cells coupled between a plurality of word lines and a plurality of bit lines. The resistance variable memory cell may be, for example, a PRAM cell. In an embodiment, the PRAM cell may include an access element and a data storage material layer configured of a phase-change material. The access element may be selected from switching elements such as a diode, a horizontal transistor, a vertical transistor, and an ovonic threshold switching (OTS) element, but the access element is not limited thereto.

The peripheral circuit may include a row selection circuit, a column selection circuit, and a read/write circuit which are controlled through the controller 110.

Figure 2:
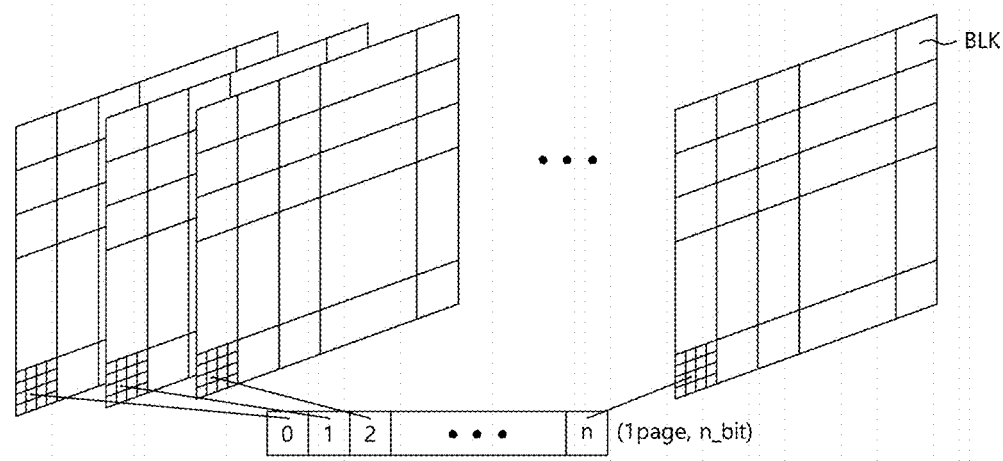
FIG. 2 is a configuration diagram illustrating a memory cell array circuit according to an embodiment of the present disclosure.

In an embodiment, the memory cell array circuit constituting the memory circuit 130 may be configured as illustrated in FIG. 2.

FIG. 2 is a configuration diagram illustrating a memory cell array circuit according to an embodiment.

A memory cell array 20 may include a plurality of mats.

Each of the plurality of mats may include a plurality of resistance variable memory cells coupled between word lines and bit lines. The plurality of resistance variable memory cells included in the mat may be divided into a plurality of blocks BLK.

For example, the mat may be configured to include a plurality of blocks BLK which include a plurality of memory cells.

In the plurality of mats, memory cells which are physically formed in the same position may refer to one page. The write operation of the resistance variable memory cell may be performed in page units and the write operation may be simultaneously performed on the plurality of pages.

In an embodiment, the unit block may be configured to include the same number of memory cells in the word line WL direction and the bit line BL direction. 'n' may be a natural number.

Figure 3:
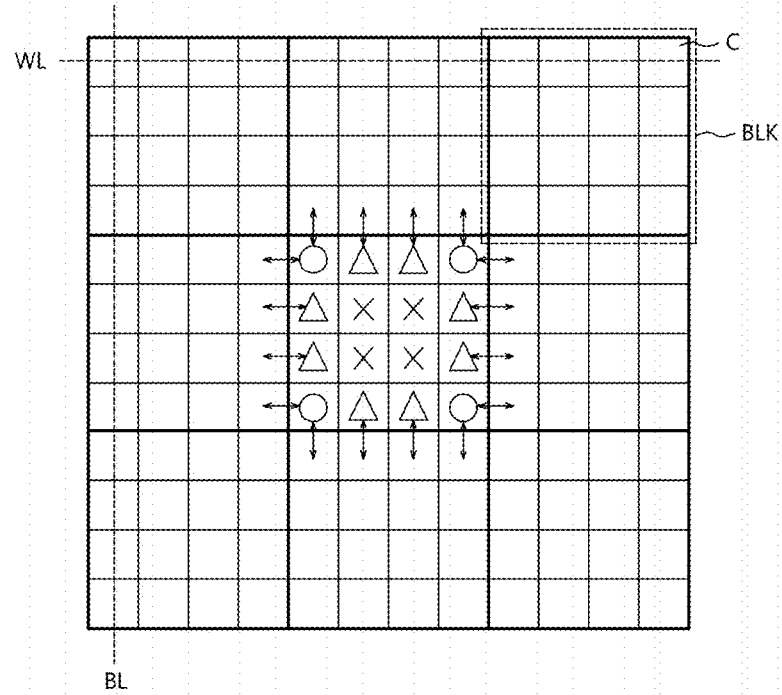
FIG. 3 is a configuration diagram illustrating a memory block according to an embodiment of the present disclosure.

FIG. 3 is a configuration diagram illustrating a memory block according to an embodiment.

Referring to FIG. 3, each mat may include a plurality of blocks BLK.

Each of the plurality of blocks BLK may include the same number of memory cells C in a word line WL direction and a bit line BL direction.

The memory cells included in the block may be divided according to the number of blocks directly adjacent thereto in up and down (up/down) and left and right (left/right) directions as follows.

1. First boundary cell-memory cell directly adjacent to two or more blocks
2. Second boundary cell-memory cell directly adjacent to one block
3. Inner cell-memory cell having no directly adjacent block In an embodiment, when each block is configured in a size of $2^n$ as illustrated in FIG. 3, the first boundary cells, which are memory cells located in corners of the block including the first boundary cells and indicated by a symbol O, may be directly adjacent to two blocks. The second boundary cells, which are memory cells located in edges of the block including the second boundary cells and indicated by a symbol Δ, may be directly adjacent to one block. The inner cells, which are not located in the corners and edges of the block including the inner cells and indicated by a symbol X, may have no block directly adjacent to the inner cells.

A reason that the memory cells included in the block are divided as described above is to consider the disturbance effect by adjacent cells according to a position of a memory cell accessed in a write operation.

For example, but not limited to, the first boundary cells may be affected by the disturbance when adjacent memory cells in the block including the first boundary cells are written and when adjacent cells which are included in two or more adjacent blocks and are adjacent to the first boundary cells are written.

The second boundary cells may be affected, for example, but not limited to, by the disturbance when adjacent memory cells in the block including the second boundary cells are written and when cells which are included in one adjacent block and are adjacent to the second boundary cells are written.

The inner cells may be affected by the disturbance only when adjacent cells in the block including the inner cells are written.

A disturbance threshold TH for the resistance variable memory cell may be estimated in a state that the effect on the adjacent memory cells is not considered. Accordingly, the threshold conditions which can prevent disturbance of the first boundary cell, the second boundary cell, and the inner cell may be differently set from each other according to a position of the memory cell based on the estimated disturbance threshold.

The disturbance preventing circuit 120 may operate in response to the write command WT and an address signal, for example, a logical address signal LA.

The disturbance preventing circuit 120 may map the input logical address signal LA to a physical address signal PA. The disturbance preventing circuit 120 may include a counter configured to manage the number of write accesses for each block of the memory cell array circuit constituting the memory circuit 130. The disturbance preventing circuit 120 may have set the threshold condition which can prevent the disturbance according to the physical positions of the memory cells constituting the block, for example, the scrubbing condition. When an output signal which is satisfied with the scrubbing condition is generated in response to an output signal of the counter, the disturbance preventing circuit 120 may generate a control signal which may control the scrubbing to be performed on the memory cells having the scrubbing conditions.

In an embodiment, the term "scrubbing" may refer to an operation which reads data in a memory cell, performs error checking and correction on the read data if necessary, and write data again in the memory cell. The term "scrubbing" may also refer to a refresh operation.

In the technology, the memory cells in each block may be divided into the first boundary cell, the second boundary cell, and the inner cell according to the physical position in the block, that is, the number of adjacent blocks. The scrubbing condition may have been previously set according to the positions of the memory cells.

The disturbance preventing circuit 120 may count the number of write accesses for each block. When the counting signal corresponding to the preset scrubbing condition is output in the write operation, the disturbance preventing circuit 120 may perform the scrubbing on the memory cells in a position corresponding to a preset scrubbing condition.

Figure 4:
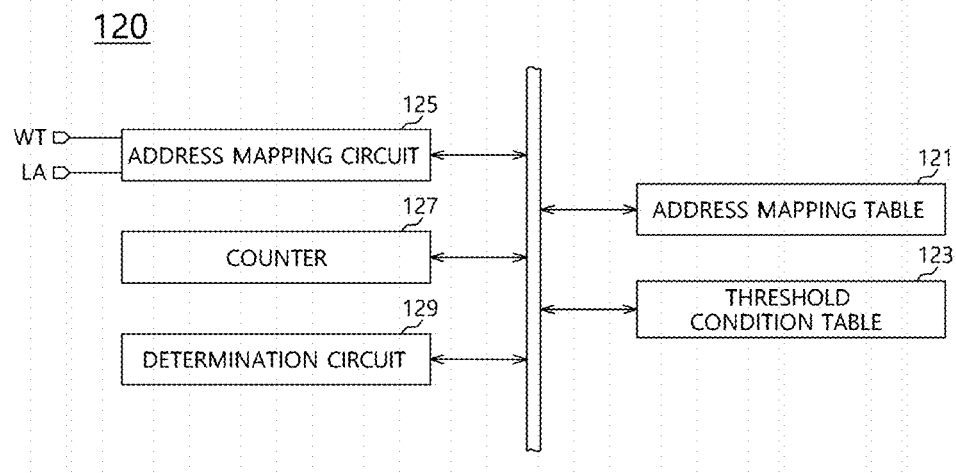
FIG. 4 is a configuration diagram illustrating a disturbance preventing circuit according to an embodiment of the present disclosure.

FIG. 4 is a configuration diagram illustrating a disturbance preventing circuit according to an embodiment.

Referring to FIG. 4, the disturbance preventing circuit 120 according to an embodiment may include an address mapping table 121, a threshold condition table 123, an address mapping circuit 125, a counter 127, and a determination circuit 129.

The address mapping table 121 may map the physical address of each memory cell in the memory circuit 130, that is, a physical address with a logical address provided from an external apparatus or a host and store a mapping result. The address mapping table 121 may also store an address of each block.

The threshold condition table 123 may store the scrubbing condition according to a position of a memory cell in each block. In an embodiment, the threshold condition table 123 may store a block replacement condition for each block.

The address mapping circuit 125 may be configured to convert the logical address signal LA to the physical address signal PA with reference to the address mapping table 121 in response to the write command WT and the logical address signal LA. A block address of the block in which the memory cell having the converted physical address signal PA is included may also be considered.

The counter 127 may be configured to manage the number of write access for a corresponding block based on the block address considered in the address mapping circuit 125. In an embodiment, when a specific block is accessed for write, the counter 127 may increase the number of write accesses of the corresponding block. When the scrubbing on the specific block is performed, the counter of the corresponding block may be initialized.

The determination circuit 129 may generate a first control signal by determining whether or not the output signal of the counter 127 is satisfied with the scrubbing condition with reference to the threshold condition table 123. The first control signal may include a scrubbing enable signal and an address signal of a scrubbing-target memory cell.

The controller 110 may control scrubbing to be performed on a corresponding memory cell in response to the first control signal generated in the determination circuit 129.

In an embodiment, the determination circuit 129 may generate a second control signal by determining whether or not the output signal of the counter 127 is satisfied with the block replacement condition with reference to the threshold condition table 123. The second control signal may include a block replacement enable signal and an address signal of a replacement-target block.

The controller 110 may control the block replacement operation for the corresponding block in response to the second control signal generated in the determination circuit 129. In an embodiment, the block replacement operation may refer to a block movement operation, a swap operation, and the like.

The scrubbing condition according to the position of the cell in the block may be set in various forms. For example, the scrubbing condition may be set only using a counting result for a block accessed for write or may be set by considering counting results for the accessed block and blocks adjacent to the accessed block.

The number of write accesses for each block may be equally managed with respect to all the memory cells included in the block or may be managed according to the positions of the cells in the block.

Regardless of the management method of the scrubbing condition or the number of write accesses, the technology may be configured to divide the memory cells into the blocks, differently set the scrubbing condition according to the position of the memory cell in the block, and perform scrubbing on the corresponding memory cell when the number of write accesses which is satisfied with the scrubbing condition is counted.

The example in FIG. 3 that the memory cells are divided into blocks having a size of $2^n$, that is, the blocks including the same number of memory cells in the word line direction and the bit line direction has been described, but the form of the block is not limited thereto.

In an embodiment, when the memory cell array circuit is designed such that the disturbance between the word lines is not represented, the memory cell array circuit may be configured to divide a plurality of memory cells arranged in one word line direction into unit blocks. In an embodiment, when the memory cell array circuit is designed such that the disturbance between the bit lines is not represented, the memory cell array circuit may be configured to divide a plurality of memory cells arranged in one bit line direction into unit blocks.

The plurality of memory cells may be divided into the plurality of blocks having the same size in such a manner that the disturbance between the blocks is minimized.

FIG. 5 is a diagram illustrating a mapping relationship between a physical address and a logical address according to an embodiment.

Referring to FIG. 5A, memory cells included in each mat MAT of the memory cell array circuit in the resistance variable memory apparatus may have physical addresses which are consecutive to the word line WL direction.

The consecutive logical addresses may be provided from an external apparatus or a host in the write operation.

In an embodiment, as illustrated in FIG. 5B, the address mapping table 121 may be configured in such a manner that the physical addresses corresponding to the logical addresses included in each logical block BLK_L are allocated to each physical block BLK_P.

Referring to FIG. 5A, the memory cells may have the consecutive physical addresses such as 0 to 31, 32 to 63, 96 to 127, . . . to the word line WL direction.

Referring to FIG. 5B, the logical addresses may be mapped to be consecutive in one logical block BLK_L such as 0 to 15, 16 to 31, 32 to 63, . . . .

Accordingly, when the write command for the memory cells having the logical addresses 0 to 15 is input, the write operation may be performed on the physical block BLK_P including the memory cells having the physical addresses corresponding to the logical addresses 0 to 15.

FIG. 6 is a flowchart illustrating a method of operating pertaining to disturbance prevention according to an embodiment.

Referring to FIG. 6, the write command WT and the logical address LA may be provided from an external apparatus or a host (S101).

The disturbance preventing circuit 120 may convert the logical address signal LA to the physical address signal PA with reference to the address mapping table 121 in response to the write command WT and the logical address signal LA and acquire a block address in which a memory cell corresponding to the converted physical address signal PA is included (S103).

The disturbance preventing circuit 120 may count the number of write accesses for the corresponding block based on the block address acquired in operation S103 (S105).

The disturbance preventing circuit 120 may store a scrubbing condition corresponding to a position of a cell in each block, and determine whether or not a counting result in operation S105 is satisfied with the scrubbing condition (S107). In an embodiment, if the disturbance preventing circuit 120 determines that the counting result in operation S105 is not satisfied with the scrubbing condition (S107) then the disturbance preventing circuit 120 may stand by 'STAND-BY' until the operation S105 is satisfied with the scrubbing condition (S107).

When the counting result is satisfied with the scrubbing condition, the disturbance preventing circuit 120 may output a control signal which controls scrubbing to be performed and perform the scrubbing on memory cells in a position corresponding to the corresponding condition under control of the controller 110 (S109).

The disturbance preventing circuit 120 may determine whether or not the counting result in operation S105 is satisfied with a block replacement condition (S111).

When the counting result is satisfied with the block replacement condition, the disturbance preventing circuit 120 may output a control signal which control the block replacement operation to be performed and perform the block replacement operation under control of the controller 110 (S113). In an embodiment, when the counting result is not satisfied with the block replacement condition, the disturbance preventing circuit 120 may stand by 'STAND-BY' until the counting result is satisfied with the block replacement condition. In an embodiment, after the block replacement operation is performed under the control of the controller 110 (S113) then the disturbance preventing circuit 120 may stand by 'STAND-BY'.

As described above, the scrubbing condition may be variously set, and hereinafter, the setup examples of the scrubbing condition will be described.

[1. In the Case of Using Only a Counter for a Block Accessed in a Write Operation]

First, the disturbance effect according to a position of a cell in a block will be described with reference to FIG. 7.

Figure 7:
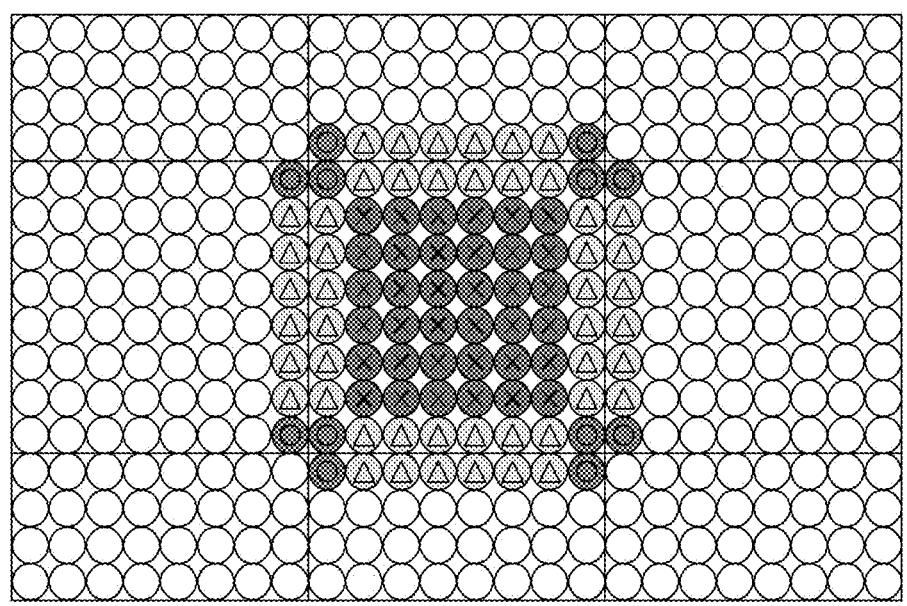
FIG. 7 is a diagram illustrating disturbance according to a position of a memory cell in a block according to an embodiment of the present disclosure.

Referring to FIG. 7, the first boundary cell indicated by the symbol O may be affected by the disturbance in the write operation for the block including the first boundary cell and two blocks adjacent thereto in the up/down and left/right directions. The second boundary cell indicated by the symbol Δ may be affected by the disturbance in the write operation for the block including the second boundary cell and one block adjacent thereto in the up/down and left/right directions. The inner cell indicated by the symbol X may be affected by the disturbance in the write operation for the block including the inner cell.

Since the disturbance effect is different according to the position of the cell in the block as described above, the scrubbing condition may be set differently according to the position of the cell.

When the disturbance threshold of the memory cell in a state that the disturbance effect is not considered is TH, the disturbance threshold of the inner cell which is affected only by the disturbance for the block including the inner cell may be represented with TH. Since the first boundary cell indicated by the symbol O is affected by the disturbance three times more than the inner cell, the disturbance threshold TH_B1 of the first boundary cell may be represented with TH/3. Since the second boundary cell indicated by the symbol Δ is affected by the disturbance twice more than the inner cell, the disturbance threshold TH_B2 of the second boundary cell may be represented with TH/2.

For example, when the disturbance threshold of the memory cell in a state that the disturbance effect is not considered is TH, the disturbance threshold of each memory cell may be set to TH/(number of adjacent blocks+1) according to the position of the memory cell in the block, that is, the number of adjacent blocks.

FIG. 8 is a diagram illustrating a disturbance preventing concept according to embodiments.

Figure 8A:
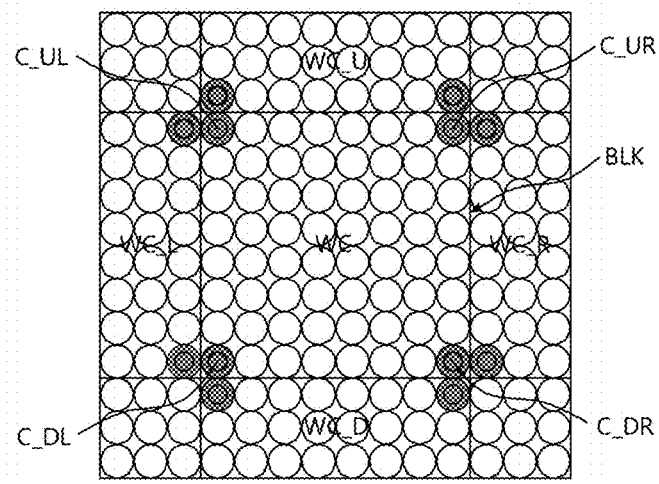
FIGS. 8A-8C are diagrams illustrating a disturbance preventing concept according to embodiments of the present disclosure.

FIG. 8A illustrates first boundary cells C_UR, C_DR, C_UL, and C_DL which are indicated by the symbol O. For example, when only a counting value WC of a block accessed in the write operation is considered, the scrubbing condition WC_B1 for the first boundary cells C_UR, C_DR, C_UL, and C_DL may be set as follows.

WC_B1=(WC mod [TH_B1])+1==TH_B1 ([x] is a maximum integer which is equal to or less than x)

Figure 8B:
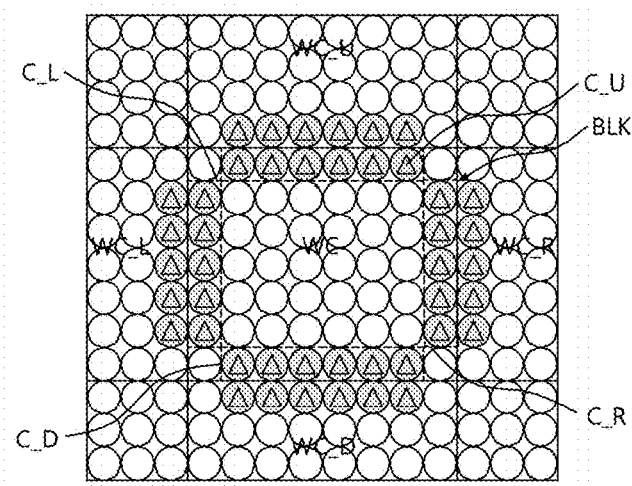

FIG. 8B illustrates second boundary cells C_U, C_R, C_L, and C_D which are indicated by the symbol Δ. For example, when only a counting value WC of a block accessed in the write operation is considered, the scrubbing condition WC_B2 for the second boundary cells C_U, C_R, C_L, and C_D may be set as follows.

$$WC\_B2=(WC \bmod [TH\_B2])+1==TH\_B2$$

Figure 8C:
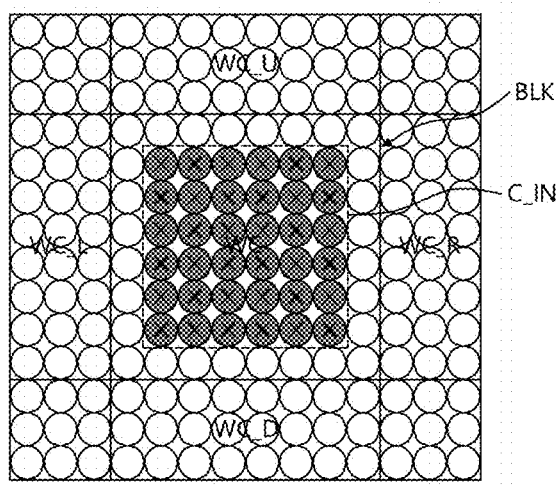

FIG. 8C illustrates an inner cell C_IN which is indicated by the symbol X. For example, when only a counting value WC of a block accessed in the write operation is considered, the scrubbing condition WC_IN for the inner cell C_IN may be set as follows.

$$WC\_IN=(WC \bmod TH)+1==TH$$

For example, when only the counting value WC of the block accessed for write is considered, the scrubbing condition may be set to perform scrubbing just before the counting value WC reaches the disturbance thresholds TH, TH_B1, and TH_B2 determined according to the positions of the memory cells.

In the embodiment, since only the counting value of the block in which data is being currently written is considered, the number of write access for a region in which the counting value is stored may be reduced, and thus an amount of calculation may be minimized.

[2. In the Case of Using a Counter of a Block Accessed in the Write Operation and a Counter of Block Adjacent Thereto]

Referring back to FIG. 8A, the first boundary cell indicated by the symbol O may be affected by the disturbance when the block including the first boundary cell and two blocks adjacent to the first boundary cell are write-accessed.

The number of write accesses of the first boundary cell indicated by the symbol O may be estimated by considering the number of accesses for the block including the first boundary cell and the blocks adjacent to the first boundary cell.

For example, the number of write accesses WC_C_UR, WC_C_DR, WC_C_UL, and WC_C_DL for the first boundary cell C_UR located in an upper right corner of a block BLK, the first boundary cell C_DR located in a lower right corner of the block BLK, the first boundary cell C_UL located in an upper left corner of the block BLK, and the first boundary cell C_DL located in a lower left corner of the block BLK may be estimated by summing a counting value WC of the block including the first boundary cells C_UR, C_DR, C_UL, and C_DL and counting values WC_U/WC_R, WC_D/WC_R, WC_U/WC_L, and WC_D/WC_L of the blocks adjacent to the first boundary cells C_UR, C_DR, C_UL, and C_DL.

$$WC\_C\_UR=WC+WC\_U+WC\_R$$

$$WC\_C\_DR=WC+WC\_D+WC\_R$$

$$WC\_C\_UL=WC+WC\_U+WC\_L$$

$$WC\_C\_DL=WC+WC\_D+WC\_L$$

When the disturbance threshold of the memory cell in a state that the disturbance effect is not considered is TH, the disturbance threshold TH_B1 of the first boundary cells C_UR, C_DR, C_UL, and C_DL may be represented with TH/3.

Accordingly, for example, the scrubbing conditions WC_B1={WC_B1_C_UR, WC_B1_C_DR, WC_B1_C_UL, and WC_B1_C_DL} for the first boundary cells C_UR, C_DR, C_UL, and C_DL may be set as follows.

$$WC\_B1\_C\_UR=(WC\_C\_UR \bmod [TH\_B1])==0$$

$$WC\_B1\_C\_DR=(WC\_C\_DR \bmod [TH\_B1])==0$$

$$WC\_B1\_C\_UL=(WC\_C\_UL \bmod [TH\_B1])==0$$

$$WC\_B1\_C\_DL=(WC\_C\_DL \bmod [TH\_B1])==0$$

In an embodiment, the scrubbing conditions WC_B1={WC_B1_C_UR, WC_B1_C_DR, WC_B1_C_UL, and WC_B1_C_DL} for the first boundary cells C_UR, C_DR, C_UL, and C_DL may be set as follows.

$$WC\_B1\_C\_UR=(WC\_C\_UR \bmod [TH\_B1])+1==TH\_B1$$

$$WC\_B1\_C\_DR=(WC\_C\_DR \bmod [TH\_B1])+1==TH\_B1$$

$$WC\_B1\_C\_UL=(WC\_C\_UL \bmod [TH\_B1])+1==TH\_B1$$

$$WC\_B1\_C\_DL=(WC\_C\_DL \bmod [TH\_B1])+1==TH\_B1$$

Referring to FIG. 8B, the second boundary cell indicated by the symbol Δ may be affected by the disturbance when the block including the second boundary cell and one block adjacent to the second boundary cell are write-accessed.

Accordingly, the number of write accesses of the second boundary cell indicated by the symbol Δ may be estimated by considering the number of write accesses for the block including the second boundary cell and the block adjacent to the second boundary cell.

For example, the number of write accesses WC_C_U, WC_C_R, WC_C_L, and WC_C_D for the second boundary cell C_U located in an upper edge of the block BLK, the second boundary cell C_R located in a right edge of the block BLK, the second boundary cell C_L located in a left edge of the block BLK, and the second boundary cell C_D located in a lower edge of the block BLK may be estimated by summing a counting value WC of the block including the second boundary cells C_U, C_R, C_L, and C_D and counting values WC_U, WC_R, WC_L, and WC_D of the blocks adjacent to the second boundary cells C_U, C_R, C_L, and C_D.

$$WC\_C\_U=WC+WC\_U$$

$$WC\_C\_R=WC+WC\_R$$

$$WC\_C\_L=WC+WC\_L$$

$$WC\_C\_D=WC+WC\_D$$

When the disturbance threshold of the memory cell in a state that the disturbance effect is not considered is TH, the disturbance threshold TH_B2 of the second boundary cells C_U, C_R, C_L, and C_D may be represented with TH/2.

Accordingly, for example, the scrubbing conditions WC_B2={WC_B2_C_U, WC_B2_C_R, WC_B2_C_L, WC_B2_C_D} for the second boundary cells C_U, C_R, C_L, and C_D may be set as follows.

$$WC\_B2\_C\_U=(WC\_C\_U \bmod [TH\_B2])==0$$

$$WC\_B2\_C\_R=(WC\_C\_R \bmod [TH\_B2])==0$$

$$WC\_B2\_C\_L=(WC\_C\_L \bmod [TH\_B2])==0$$

$$WC\_B2\_C\_D=(WC\_C\_D \bmod [TH\_B2])==0$$

In an embodiment, the scrubbing conditions WC_B2={WC_B2_C_U, WC_B2_C_R, WC_B2_C_L, and WC_B2_C_D} for the second boundary cells C_U, C_R, C_L, and C_D may be set as follows.

$$WC\_B2\_C\_U=(WC\_C\_U \bmod [TH\_B2])+1==TH\_B2$$

$$WC\_B2\_C\_R=(WC\_C\_R \bmod [TH\_B2])+1==TH\_B2$$

$$WC\_B2\_C\_L=(WC\_C\_L \bmod [TH\_B2])+1==TH\_B2$$

$$WC\_B2\_C\_D=(WC\_C\_D \bmod [TH\_B2])+1==TH\_B2$$

FIG. 8C illustrates the inner cell C_IN. Even when a counting value WC of a block accessed in a write operation and counting values WC_U, WC_R, WC_L, and WC_D of adjacent blocks are considered, the inner cell C_IN may be affected only by the block including the inner cell. Accordingly, for example, the scrubbing condition WC_IN for the inner cell C_IN may be set as follows.

$$WC\_IN=(WC \bmod TH)==0$$

In an embodiment, the scrubbing condition for the inner cell may be set as follows.

$$WC\_IN=(WC \bmod TH)+1==TH$$

For example, the counting values WC_U, WC_R, WC_L, and WC_D may also be considered in addition to the counting value WC of the block accessed for write, and thus the scrubbing may be performed at a more accurate time of point.

As described above, the disturbance effects on the memory cells located in the boundaries of the block and the memory cells in the inner side of the block may be different from each other.

Accordingly, the more accurate control may be accomplished through separate management for a counter for the inner cell and a counter for a boundary cell.

Figure 9:
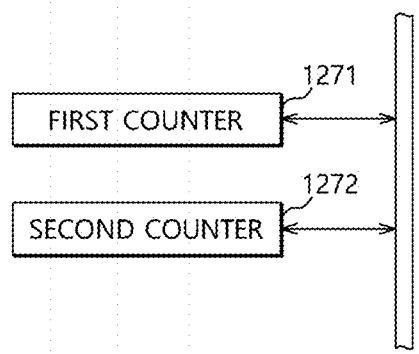
FIG. 9 is a configuration diagram illustrating a counter according to an embodiment of the present disclosure.

FIG. 9 is a configuration diagram illustrating a counter according to an embodiment.

Referring to FIG. 9, a counter 127-1 may include a first counter 1271 and a second counter 1272.

The first counter 1271 may be configured to count the number of access for cells located in the boundary in the block, that is, the first boundary cell and the second boundary cell.

The second counter 1272 may be configured to count the number of access for the inner cells in the block.

When the physical address of a memory cell in a block accessed in the write operation is included in the boundary cell, the number of accesses may be counted through the first counter 1271.

When the physical address of the memory cell in the block accessed in the write operation is included in the inner cell, the number of accesses may be counted through the second counter 1272.

Examples that the scrubbing is performed by dividing the inner cell and the boundary cell using a plurality of counters will be described below.

[1. In the Case of Dividing Memory Cells into Inner Cells and Boundary Cells]

Figure 10:
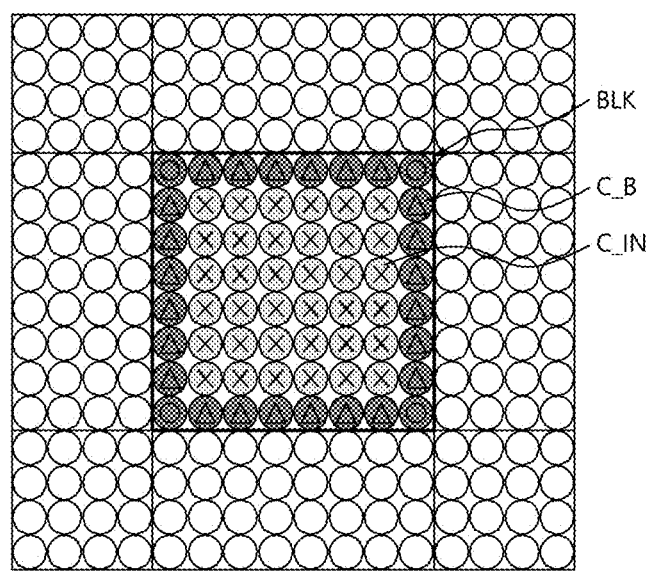
FIG. 10 and FIGS. 11A-11F are diagrams illustrating a disturbance preventing concept according to embodiments of the present disclosure.

Referring to FIG. 10, memory cells in each block BLK may be divided into a boundary cell C_B and an inner cell C_IN.

When a memory cell accessed in the write operation is a boundary cell C_B based on a physical address of the accessed memory cell, the counter 127-1 may count the number of write access BC_C_B for the boundary cell C_B using the first counter 1271. Similarly, the counter 127-1 may count the number of write access WC_C_IN for the inner cell C_IN using the second counter 1272.

The boundary cell C_B may include a first boundary cell (O) which is affected by the disturbance through two adjacent blocks and a second boundary cell (Δ) which is affected by the disturbance through one adjacent block.

When the disturbance threshold of the memory cell in a state that the disturbance effect is not considered is TH, the disturbance threshold TH_B1 of the first boundary cell (O) may be represented with TH/3 and the disturbance threshold TH_B2 of the second boundary cell (Δ) may be represented with TH/2.

For example, the scrubbing condition BC_B1 for the first boundary cell (O) may be set as follows.

$$BC\_B1=(BC\_C\_B \bmod [TH\_B1])+1==TH\_B1$$

For example, the scrubbing condition BC_B2 for the second boundary cell (Δ) may be set as follows.

$$BC\_B2=(BC\_C\_B \bmod [TH\_B2])+1==TH\_B2$$

For example, the scrubbing condition WC_IN for the inner cell (X) C_IN may be set as follows.

$$WC\_IN=(WC \bmod TH)+1==TH$$

Even when the scrubbing is performed by separately providing the first counter 1271 for the boundary cell and the second counter 1272 for the inner cell, the scrubbing condition may be set by considering a counting value of the first counter 1271 for a boundary cell of an adjacent block.

[2. In the Case of Subdividing Inner Cells According to the Position to the Boundary Cell]

Figure 11A:
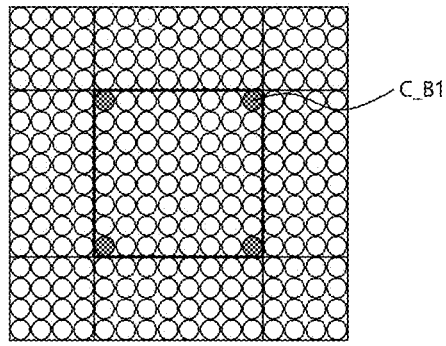
Figure 11D:
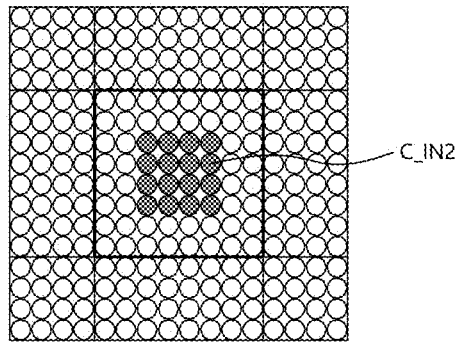
Figure 11B:
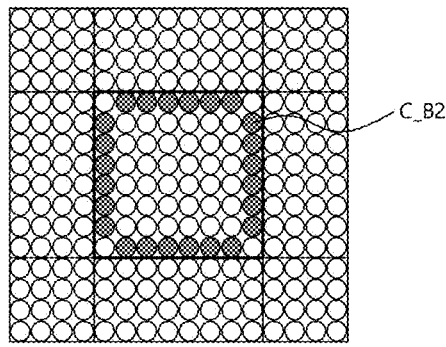

Referring to FIG. 11, memory cells in each block may include a first boundary cell C_B1 which is directly adjacent to two blocks (see FIG. 11A), a second boundary cell C_B2 which is directly adjacent to one block (see FIG. 11B), a first inner cell C_IN1 which is adjacent to the first and second boundary cells C_B1 and C_B2 (see FIG. 11C), and a second inner cell C_IN2 which is not adjacent to the first and second boundary cells C_B1 and C_B2 (see FIG. 11D).

When a memory cell accessed in the write operation is included in the boundary cells C_B1 and C_B2 based on a physical address of the accessed memory cell, the counter 127-1 may count the number of write access BC_C_B for the boundary cells C_B1 and C_B2 using the first counter 1271. Similarly, When the accessed memory cell is included in the inner cells C_IN1 and C_IN2, the counter 127-1 may count the number of write access WC_C_IN for the inner cells C_IN1 and C_IN2 using the second counter 1272.

When the disturbance threshold of the memory cell in a state that the disturbance effect is not considered is TH, the disturbance threshold TH_B1 of the first boundary cell C_B1 may be represented with TH/3 and the disturbance threshold TH_B2 of the second boundary cell C_B2 may be represented with TH/2.

Accordingly, for example, the scrubbing condition BC_B1 for the first boundary cell C_B1 and the scrubbing condition BC_B2 for the second boundary cell C_B2 may be set as follows.

$$BC\_B1=(BC\_C\_B1 \bmod [TH\_B1])+1==TH\_B1$$

$$BC\_B2=(BC\_C\_B2 \bmod [TH\_B2])+1==TH\_B2$$

The first inner cell C_IN1 may be affected by the disturbance when the first and second inner cells C_IN1 and C_IN2 are write-accessed and when the boundary cells C_B1 and C_B2 are write-accessed.

Accordingly, the number of write access WC_C_IN1 for the first inner cell C_IN1 may be estimated by considering the number of write access WC_C_IN for the inner cells C_IN1 and C_IN2 and the number of write access BC_C_B for the boundary cells C_B1 and C_B2.

$$WC\_C\_IN1=WC\_C\_IN+BC\_C\_B$$

Accordingly, for example, the scrubbing condition WC_IN1 for the first inner cell C_IN1 may be set as follows.

$$WC\_IN1=(WC\_C\_IN1 \bmod TH])+1==TH$$

For example, the scrubbing condition WC_IN2 for the second inner cell C_IN2 may be set as follows.

$$WC\_IN2=(WC\_C\_IN \bmod TH)+1==TH$$

Figure 11E:
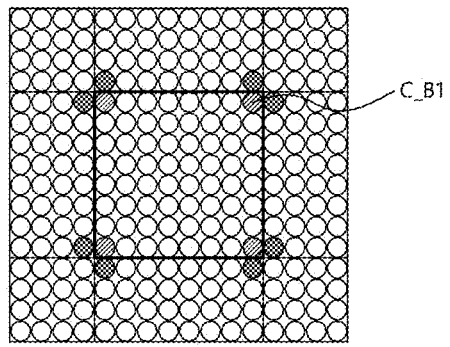
Figure 11C:
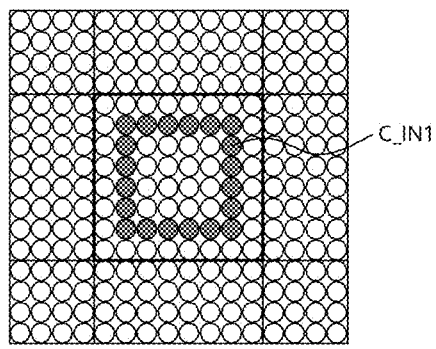

When the scrubbing condition for the first boundary cell C_B1 is satisfied in performing the scrubbing with the above-described scrubbing condition, the scrubbing may be simultaneously performed on the first boundary cell C_B1 and the first boundary cells of blocks adjacent to the first boundary cell C_B1 as illustrated in FIG. 11E.

Figure 11F:
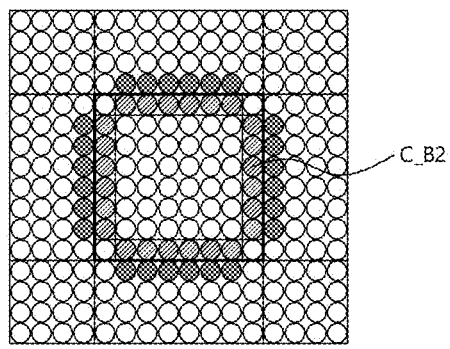

Similarly, when the scrubbing condition for the second boundary cell C_B2 is satisfied, the scrubbing may be simultaneously performed on the second boundary cells and the second boundary cells of blocks adjacent to the second boundary cell C_B2 as illustrated in FIG. 11F.

In an embodiment, even when the scrubbing condition is managed by separately providing the first counter 1271 for the boundary cell and the second counter 1272 for the inner cell and by further subdividing the inner cell according to a position to the boundary cell, the scrubbing condition may be set by considering a counting value of the first counter 1271 for a boundary cell of an adjacent block.

The number of counters may be increased to more accurately determine the scrubbing target.

Figure 12:
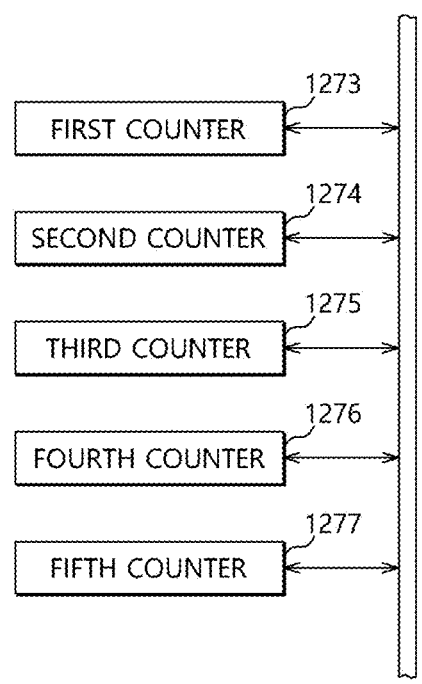
FIG. 12 is a configuration diagram illustrating a counter according to an embodiment of the present disclosure.
Figure 13:
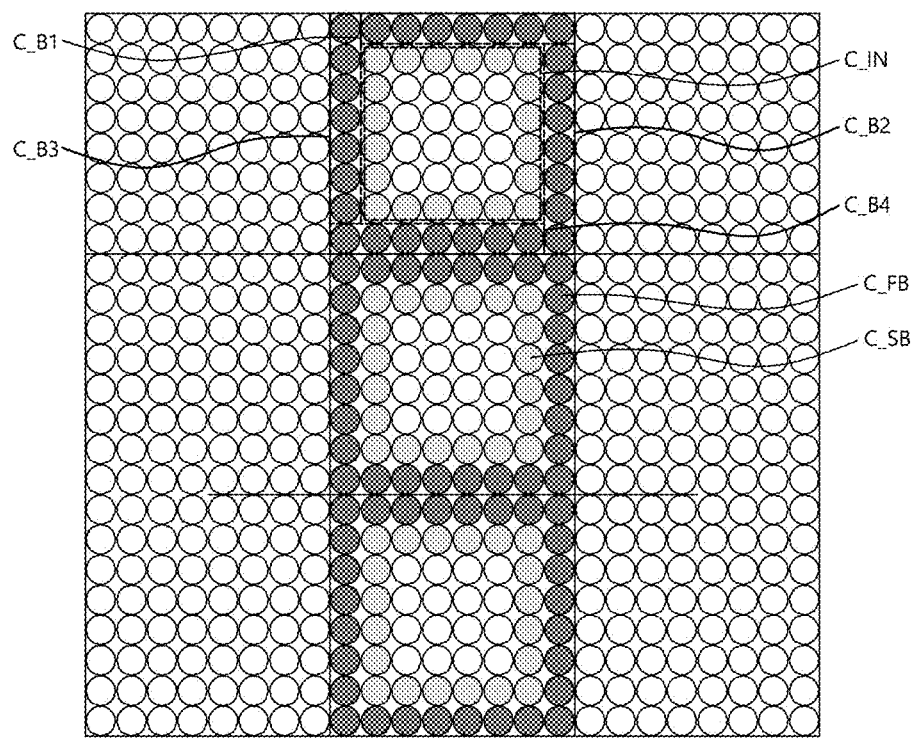
FIG. 13 is a diagram illustrating a disturbance preventing concept according to an embodiment.

FIG. 12 is a configuration diagram illustrating a counter according to an embodiment and FIG. 13 is a diagram illustrating a disturbance prevention concept according to an embodiment.

Referring to FIG. 13, memory cells in each block may be divided into an outer boundary cell C_FB, an inner boundary cell C_SB, and an inner cell C_IN.

The outer boundary cell C_FB may be further divided into a first outer boundary cell C_B1 located in an upper edge of the block, a second outer boundary cell C_B2 located in an right edge of the block, a third outer boundary cell C_B3 located in a left edge of the block, and a fourth outer boundary cell C_B4 located in a lower edge of the block.

Referring to FIGS. 12 and 13, a counter 127-2 according to an embodiment may include a first counter 1273, a second counter 1274, a third counter 1275, a fourth counter 1276, and a fifth counter 1277.

The first counter 1273 may count the number of write access for the first outer boundary cells C_B1. The second counter 1274 may count the number of write accesses for the second outer boundary cells C_B2. The third counter 1275 may count the number of write accesses for the third outer boundary cells C_B3. The fourth counter 1276 may count the number of write accesses for the fourth outer boundary cells C_B4. The fifth counter 1277 may be configured to count the number of write accesses for the inner cells C_IN.

When a memory cell accessed for the write operation is included in the outer boundary cell C_FB, the number of write accesses BC_C_FC for the outer boundary cell C_FC may be estimated by increasing a counting value of a counter corresponding to a position of the accessed memory cell among the first to fourth counters 1273 to 1276. Further, a counting value for a boundary cell of a block adjacent to the corresponding memory cell may be further increased.

When a memory cell accessed for the write operation is included in the inner boundary cell C_SB, a counting value of the fifth counter 1277 which counts the number of write accesses WC_C_IN for the inner cell and a counting value of a counter, which is any one of the counters 1273 to 1276, for the outer boundary cell C_FB adjacent to the accessed memory cell may be increased.

When a memory cell accessed for the write operation is included in the inner cell C_IN, the number of write accesses WC_C_IN for the inner cell C_IN may be estimated by increasing a counting value of the fifth counter 1277.

For example, the scrubbing condition BC_Bx for the outer boundary cell C_FB and the scrubbing condition WC_IN for the inner cell C_IN may be set based on the number of write accesses BC_C_FB={BC_C_Bx} (x=0, 1, 2, 3) for the outer boundary cell C_FB={C_B1, C_B2, C_B3, C_B4} and the number of write accesses WC_C_IN for the inner cell C_IN as follows, wherein the disturbance threshold TH_B3 of the outer boundary cell C_FB may be a preset value.

$$BC\_Bx(x=0,1,2,3)=(BC\_C\_FB \bmod TH\_B3)+1==TH\_B3$$

$$WC\_IN=(WC\_C\_IN \bmod TH])+1==TH$$

In an embodiment, the outer boundary cell C_FB may be divided according to a position of the outer boundary cell C_FB, and the disturbance threshold TH_B3 of the outer boundary cell C_FB which is directly adjacent to two blocks may be set to TH_B1. Similarly, the disturbance threshold TH_B3 of the outer boundary cell C_FB which is directly adjacent to one block may be set to TH_B2.

The outer boundary cell C_FB may be grouped by the same number of cells that the physical positions are adjacent to each other and may be divided into the first to fourth boundary cells C_B1, C_B2, C_B3, and C_B4. For example, the first to fourth counters 1273 to 1276 may perform a counting operation on the same number of boundary cells C_B1, C_B2, C_B3, and C_B4, and thus the concentration of an operation on a specific counter may be prevented.

FIGS. 14 to 18 are configuration diagrams illustrating examples of a representation of an electronic apparatus according to various embodiments of the present technical spirit.

Figure 14:
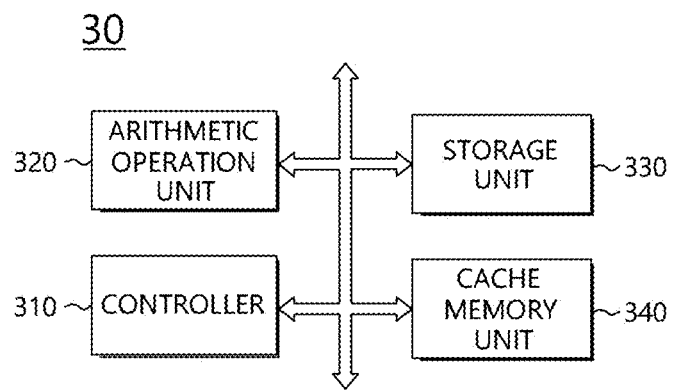
FIGS. 14 to 18 are configuration diagrams illustrating electronic apparatuses according to embodiments of the present disclosure.

FIG. 14 is a configuration diagram illustrating an example of a representation of a processor as an electronic apparatus according to an embodiment of the present technical spirit.

Referring to FIG. 14, a processor 30 may include a controller 310, an arithmetic operation unit 320, a storage unit 330, and a cache memory unit 340.

The controller 310 may control an overall operation of the processor 30 such as operations of decoding a command, performing input, output, or processing on data, and the like by receiving a signal such as the command or the data from an external apparatus.

The arithmetic operation unit 320 may perform several arithmetic operations according to a decoding result of the command in the controller 310. The arithmetic operation unit 320 may include at least one arithmetic and logic unit (ALU), but this is not limited thereto.

The storage unit 330 may serve as a register, and may be configured to store data in the processor 30. The storage unit 330 may include a data register, an address register, a floating-point register, and other various registers. The storage unit 330 may store addresses in which data operated in the arithmetic operation unit 320, data according to an operation result, and data to be processed in the arithmetic operation unit 320 are stored.

The storage unit 330 may be formed of a resistance variable memory apparatus, and for example, the storage unit 330 may include the controller 110, the disturbance preventing circuit 120, and the memory circuit 130 as illustrated in FIG. 1. The memory circuit 130 may include a memory cell array circuit configured of a plurality of resistance variable memory cells. The memory cell array circuit may be configured to include a plurality of mats, and each of the plurality of mats may be configured to include a plurality of blocks including a plurality of memory cells.

The disturbance preventing circuit 120 may operate in response to the write command WT and an address signal. The disturbance preventing circuit 120 may include a counter configured to manage the number of write accesses for each block in the memory cell array circuit constituting the memory circuit 130. Based on the scrubbing condition according to physical positions of the memory cells constituting each block, when an output signal of the counter is satisfied with a preset scrubbing condition, the disturbance preventing circuit may be configured to generate a control signal which controls the scrubbing to be performed on memory cells having the scrubbing condition.

One counter may be provided in each block or a plurality of counters may be provided in each block. When the plurality of counters are provided in the block, the number of write accesses for memory cells located in a boundary of the block and the number of write accesses for memory cells located in an inner side of the block may be separately managed.

The scrubbing condition according to the physical position of the memory cell may be variously set. For example, the scrubbing condition may be set based on a counting value for a write-accessed block. In other examples, the scrubbing condition may be set based on the number of write access for the write-accessed block and the number of write access for an adjacent block.

The cache memory unit 340 may serve as a temporary storage space.

The processor 30 illustrated in FIG. 14 may be a central processing unit (CPU) of an electronic apparatus, a graphic processing unit (GPU), a digital signal processor (DSP), an application processor (AP), and the like.

Figure 15:
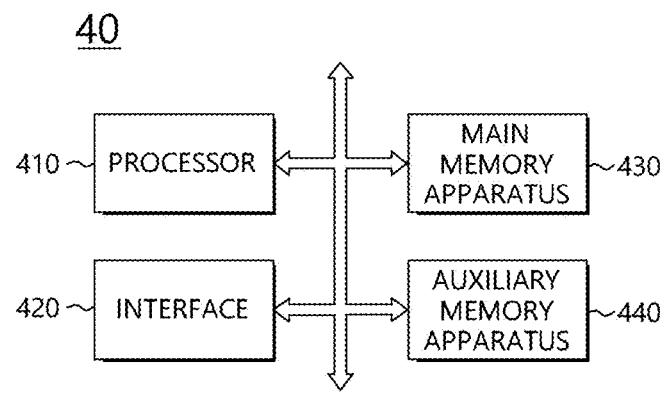
Figure 16:
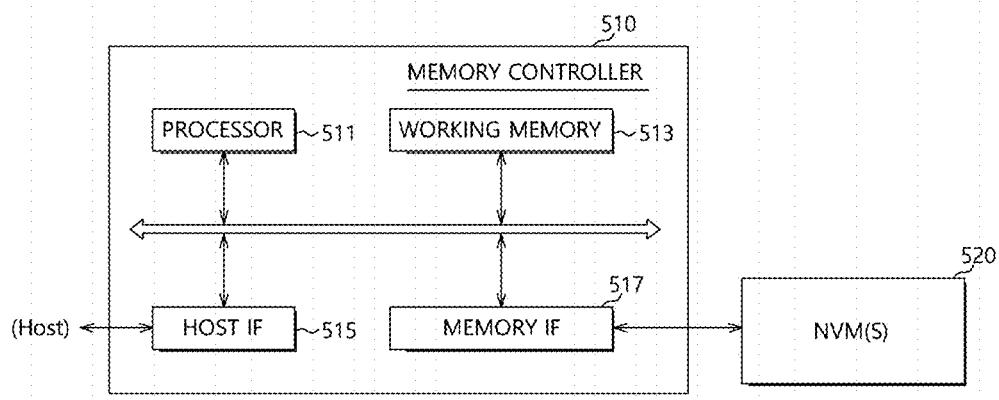

FIGS. 15 and 16 are configuration diagrams illustrating examples of a representation of a data processing system as an electronic apparatus according to various embodiments of the present technical spirit.

A data processing system 40 illustrated in FIG. 15 may include a processor 410, an interface 420, a main memory apparatus 430, and an auxiliary memory apparatus 440.

The data processing system 40 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV).

In other embodiments, the data processing system 40 may be a data storage apparatus. The data processing system 40 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card.

The processor 410 may exchange data between the main memory apparatus 430 and an external apparatus through the interface 420, and the processor 410 may perform an overall operation such as decoding of commands input from the external apparatus through the interface 420 and an operation or comparison of data stored in the system.

The interface 420 may provide an environment that a command and data are exchangeable between the external apparatus and the data processing system 40. The interface 420 may be a man-machine interface apparatus which includes an input apparatus (for example, a keyboard, a keypad, a mouse, a voice recognition apparatus, and the like) and an output apparatus (for example, a display, speaker, and the like) or a card interface apparatus or a disc interface apparatus (for example, Integrated Drive Electronics (IDE), Small Computer System Interface (SCSI), Serial Advanced Technology Attachment (SATA), External SATA (eSATA), Personal Computer Memory Card International Association (PCMCIA), and the like) according to an application environment of the data processing system 40.

The main memory apparatus 430 may store an application, a control signal, data, and the like required for an operation of the data processing system 40, and may serve as a storage space which may transfer and execute program or data from the auxiliary storage apparatus 440. The main memory apparatus 430 may be implemented using a nonvolatile memory apparatus.

The auxiliary memory apparatus 440 may be a space for storage of a program code, data, and the like, and may be a high-capacity memory apparatus. For example, the auxiliary memory apparatus 440 may be implemented using a nonvolatile memory apparatus.

The main memory apparatus 430 and the auxiliary memory apparatus 440 may be formed of a resistance variable memory apparatus, and for example, the main memory apparatus 430 and the auxiliary memory apparatus 440 may include the controller 110, the disturbance preventing circuit 120, and the memory circuit 130 as illustrated in FIG. 1. The memory circuit 130 may include a memory cell array circuit configured of a plurality of resistance variable memory cells. The memory cell array circuit may include a plurality of mats, and each of the plurality of mats may be configured to include a plurality of blocks including a plurality of memory cells.

The disturbance preventing circuit 120 may operate in response to the write command WT and an address signal. The disturbance preventing circuit 120 may include a counter configured to manage the number of write accesses for each block in the memory cell array circuit constituting the memory circuit 130. Based on the scrubbing condition according to physical positions of the memory cells constituting each block, when an output signal of the counter is satisfied with a preset scrubbing condition, the disturbance preventing circuit may be configured to generate a control signal which controls the scrubbing to be performed on memory cells having the scrubbing condition.

One counter may be provided in each block or a plurality of counters may be provided in each block. When the plurality of counters are provided in the block, the number of write accesses for memory cells located in a boundary of the block and the number of write accesses for memory cells located in an inner side of the block may be separately managed.

The scrubbing condition according to the physical position of the memory cell may be variously set. For example, the scrubbing condition may be set based on a counting value for a write-accessed block. In other examples, the scrubbing condition may be set based on the number of write access for the write-accessed block and the number of write access for an adjacent block.

A data processing system 50 illustrated in FIG. 16 may include a memory controller 510 and a nonvolatile memory apparatus (NVM) 520.

The memory controller 510 may be configured to access the nonvolatile memory apparatus 520 in response to a request from a host. The memory controller 510 may include a processor 511, a working memory 513, a host interface 515, and a memory interface 517.

The processor 511 may be configured to control an overall operation of the memory controller 510. The working memory 513 may store an application, data, a control signal, and the like required for the operation of the memory controller 510.

The host interface 515 may perform protocol conversion for exchange of data and a control signal between the host and the memory controller 510, and the memory interface 517 may perform protocol conversion for exchange of data and a control signal between the memory controller 510 and the nonvolatile memory apparatus 520.

In an embodiment, the nonvolatile memory apparatus 520 and/or the working memory 513 may be formed of a resistance variable memory apparatus, and for example, the nonvolatile memory apparatus 520 and/or the working memory 513 may include the controller 110, the disturbance preventing circuit 120, and the memory circuit 130 as illustrated in FIG. 1. The memory circuit 130 may include a memory cell array circuit configured of a plurality of resistance variable memory cells. The memory cell array circuit may be configured to include a plurality of mats, and each of the plurality of mats may be configured to include a plurality of blocks including a plurality of memory cells.

The disturbance preventing circuit 120 may operate in response to the write command WT and an address signal. The disturbance preventing circuit 120 may include a counter configured to manage the number of write accesses for each block in the memory cell array circuit constituting the memory circuit 130. Based on the scrubbing condition according to physical positions of the memory cells constituting each block, when an output signal of the counter is satisfied with a preset scrubbing condition, the disturbance preventing circuit may be configured to generate a control signal which controls the scrubbing to be performed on memory cells having the scrubbing condition.

One counter may be provided in each block or a plurality of counters may be provided in each block. When the plurality of counters are provided in the block, the number of write accesses for memory cells located in a boundary of the block and the number of write accesses for memory cells located in an inner side of the block may be separately managed.

The scrubbing condition according to the physical position of the memory cell may be variously set. For example, the scrubbing condition may be set based on a counting value for a write-accessed block. In other examples, the scrubbing condition may be set based on the number of write access for the write-accessed block and the number of write access for an adjacent block.

The data processing system 50 illustrated in FIG. 16 may be used as a disc apparatus or internal/external memory cards of a portable electronic apparatus. The data processing system 50 may be used as an image processor and other application chipsets.

Figure 17:
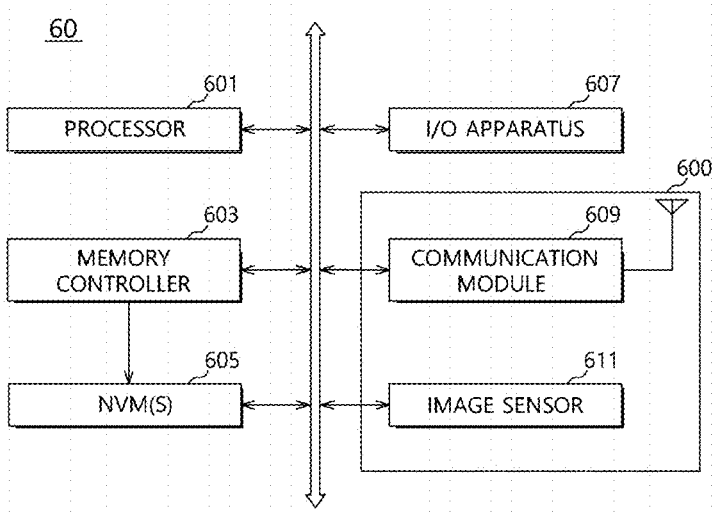
Figure 18:
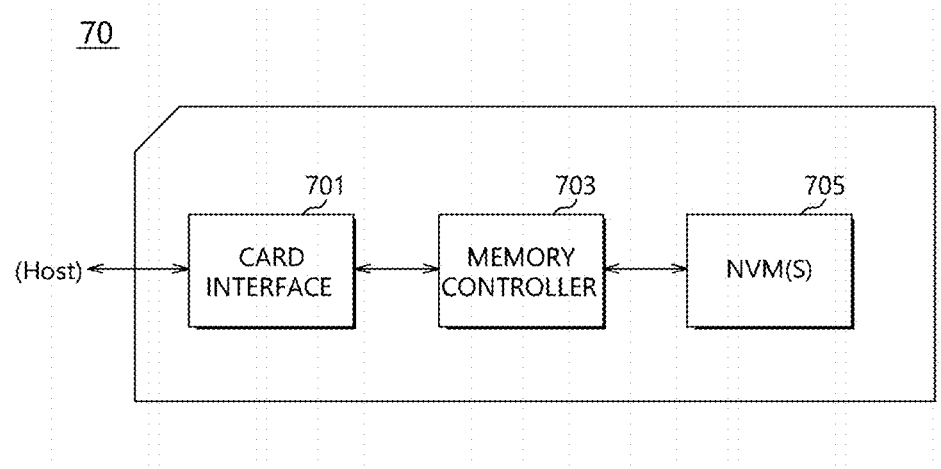

FIGS. 17 and 18 are configuration diagrams illustrating other examples of a representation of an electronic apparatus according to various embodiments of the present technical spirit.

An electronic apparatus 60 illustrated in FIG. 17 may include a processor 601, a memory controller 603, a nonvolatile memory apparatus (NVM) 605, an input and output (input/output) (I/O) apparatus 607, and a function module 600.

The memory controller 603 may control a data processing operation, for example, a write operation, a read operation, and the like of the nonvolatile memory apparatus 605 according to control of the processor 601.

Data programmed in the nonvolatile memory apparatus 605 may be output through the I/O apparatus 607 according to control of the processor 601 and the memory controller 603. For example, the I/O apparatus 607 may include a display apparatus, a speaker apparatus, and the like.

In an embodiment, the nonvolatile memory apparatus 605 may be formed of a resistance variable memory apparatus, and for example, the nonvolatile memory apparatus 605 may include the controller 110, the disturbance preventing circuit 120, and the memory circuit 130 as illustrated in FIG. 1. The memory circuit 130 may include a memory cell array circuit configured of a plurality of resistance variable memory cells. The memory cell array circuit may be configured to include a plurality of mats, and each of the plurality of mats may be configured to include a plurality of blocks including a plurality of memory cells.

The disturbance preventing circuit 120 may operate in response to the write command WT and an address signal. The disturbance preventing circuit 120 may include a counter configured to manage the number of write accesses for each block in the memory cell array circuit constituting the memory circuit 130. Based on the scrubbing condition according to physical positions of the memory cells constituting each block, when an output signal of the counter is satisfied with a preset scrubbing condition, the disturbance preventing circuit may be configured to generate a control signal which controls the scrubbing to be performed on memory cells having the scrubbing condition.

One counter may be provided in each block or a plurality of counters may be provided in each block. When the plurality of counters are provided in the block, the number of write accesses for memory cells located in a boundary of the block and the number of write accesses for memory cells located in an inner side of the block may be separately managed.

The scrubbing condition according to the physical position of the memory cell may be variously set. For example, the scrubbing condition may be set based on a counting value for a write-accessed block. In another example, the scrubbing condition may be set based on the number of write access for the write-accessed block and the number of write access for an adjacent block.

The I/O apparatus 607 may also include an input apparatus, and the I/O apparatus 607 may input a control signal for controlling an operation of the processor 601 or data to be processed in the processor 601 through the input apparatus.

In other embodiments, the memory controller 603 may be implemented with a portion of the processor 601 or a separate chipset from the processor 601.

The function module 600 may be a module which may perform a function selected according to an application example of the electronic apparatus 60 illustrated in FIG. 17, and a communication module 609 and an image sensor 611 as an example of the function module 600 are illustrated in FIG. 17.

The communication module 609 may provide a communication environment that the electronic apparatus 60 is coupled to a wired or wireless communication network to exchange data and a control signal.

The image sensor 611 may convert an optical image to digital image signals and transfer the digital image signals to the processor 601 and the memory controller 603.

When the function module 600 includes the communication module 609, the electronic apparatus 60 of FIG. 17 may be a portable communication apparatus such as a wireless communication terminal. When the function module 600 may include the image sensor 611, the electronic apparatus 60 may be a digital camera, a digital camcorder, or an electronic system (for example, a personal computer (PC), a laptop computer, a mobile communication terminal, and the like) to which any one of the digital camera and the digital camcorder is attached.

The electronic apparatus 60 may also include both the communication module 609 and the image sensor 611.

An electronic apparatus 70 illustrated in FIG. 18 may include a card interface 701, a memory controller 703, and a nonvolatile memory apparatus (NVM) 705.

FIG. 18 is an illustrative diagram illustrating the electronic apparatus 70 used as a memory card or a smart card, and the electronic apparatus 70 illustrated in FIG. 18 may be any one among a PC card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may refer to hardware which may support a protocol used in the host, software installed in the hardware which may support the protocol used in the host, or a signal transmission method.

The memory controller 703 may control data exchange between the nonvolatile memory apparatus 705 and the card interface 701.

The nonvolatile memory apparatus 705 may be formed of a resistance variable memory apparatus, and for example, the nonvolatile memory apparatus 705 may include the controller 110, the disturbance preventing circuit 120, and the memory circuit 130 as illustrated in FIG. 1. The memory circuit 130 may include a memory cell array circuit configured of a plurality of resistance variable memory cells. The memory cell array circuit may be configured to include a plurality of mats, and each of the plurality of mats may be configured to include a plurality of blocks including a plurality of memory cells.

The disturbance preventing circuit 120 may operate in response to the write command WT and an address signal. The disturbance preventing circuit 120 may include a counter configured to manage the number of write accesses for each block in the memory cell array circuit constituting the memory circuit 130. Based on the scrubbing condition according to physical positions of the memory cells constituting each block, when an output signal of the counter is satisfied with a preset scrubbing condition, the disturbance preventing circuit may be configured to generate a control signal which controls the scrubbing to be performed on memory cells having the scrubbing condition.

One counter may be provided in each block or a plurality of counters may be provided in each block. When the plurality of counters are provided in the block, the number of write accesses for memory cells located in a boundary of the block and the number of write accesses for memory cells located in an inner side of the block may be separately managed.

The scrubbing condition according to the physical position of the memory cell may be variously set. For example, the scrubbing condition may be set based on a counting value for a write-accessed block. In another example, the scrubbing condition may be set based on the number of write accesses for the write-accessed block and the number of write accesses for an adjacent block.

The above described embodiments of the present description are intended to illustrate and not to limit the present description. Various alternatives and equivalents are possible. The description is not limited by the embodiments described herein. Nor is the description limited to any specific type of semiconductor device. Other additions, subtractions, or modifications are obvious in view of the present disclosure and are intended to fall within the scope of the appended claims.

What is claimed is:

1. A method of a resistance variable memory apparatus including a memory circuit configured to include a plurality of blocks, each block including a plurality of memory cells, the method comprising:
    setting a preset scrubbing condition through a determination circuit according to a physical position of the memory cell in the block;
    outputting a counting signal through a counter corresponding to the number of write accesses for each of the plurality of blocks; and
    performing scrubbing on a memory cell having the preset scrubbing condition through an address mapping circuit when a counting signal which is satisfied with the preset scrubbing condition is output based on the counting signal, a write command, and an address signal.

2. The method of claim 1, wherein the preset scrubbing condition is set to prevent a disturbance effect caused by adjacent cells of the memory cell being accessed in a write operation.

3. The method of claim 1, wherein the scrubbing condition is set based on a disturbance threshold value preset according to the number of write accesses and the physical position of the memory cell.

4. The method of claim 1, wherein the number of write accesses are the number of accesses only for a block accessed for a write operation.

5. The method of claim 1, wherein the number of write accesses includes the number of accesses for a block accessed for a write operation and the number of access for a block adjacent to the accessed block.

6. The method of claim 1, wherein a disturbance threshold of the memory cell in a state that a disturbance effect is not considered, based on the physical position of the memory cell in the block, is divided according to the number of blocks directly adjacent to the memory cell to provide for a disturbance threshold of the memory cell in the state that the disturbance effect is considered.

7. The method of claim 1, wherein the memory cell is configured to include a boundary cell located within an edge and a corner of the block and an inner cell confined by the boundary cell according to a physical position in the block.

8. The method of claim 7, wherein the inner cell is configured to include a first inner cell directly adjacent to the boundary cell and a second inner cell confined by the first inner cell.

9. The method of claim 1, wherein the memory cell is divided into a boundary cell adjacent to at least one block and an inner cell confined by the boundary cell, and the counting signal includes at least one first counting signal corresponding to the number of write access for the boundary cell and a second counting signal corresponding to the number of write access for the inner cell.

10. The method of claim 1, wherein the address signal is a logical address, the method further comprising converting the logical address to a physical address based on the address signal.

11. The method of claim 1, wherein each of the plurality of blocks is configured of the same number of memory cells in a word line direction and a bit line direction.

12. The method of claim 1, further comprising:

setting a block replacement condition for the plurality of blocks; and performing block replacement on a corresponding block when a counting signal is satisfied with the block replacement condition.

13. A method of scrubbing a resistance variable memory apparatus, the method comprising:

setting a preset scrubbing condition for a memory cell through a determination circuit according to a physical position of the memory cell in a block, wherein the preset scrubbing condition is based on a number of write accesses for adjacent blocks and the block including the memory cell as well as a disturbance threshold of the memory cell;

counting the number of write accesses through a counter for the adjacent blocks and the block including the memory cell to obtain a value;

using the value to determine if the preset scrubbing condition is satisfied through the determination circuit; and scrubbing the memory cell through an address mapping circuit if the preset scrubbing condition is satisfied.

14. The method of claim 13, wherein the disturbance threshold of the memory cell is a disturbance threshold of the memory cell in a state that a disturbance effect is not considered, based on the physical position of the memory cell in the block, divided by the number of blocks directly adjacent to the memory cell.

15. The method of claim 13, wherein scrubbing the memory cell comprises:

reading data in the memory cell;

performing error checking on the read data; and writing data into the memory cell.

16. The method of claim 13, wherein scrubbing the memory cell comprises:

refreshing the memory cell.

17. The method of claim 13, wherein the resistance variable memory apparatus includes a memory circuit including a plurality of blocks, each of the blocks including a plurality of memory cells.

18. The method of claim 13, further comprising:

converting a logical address signal to a physical address signal based on a write command and the logical address signal; and acquiring a block address in which a memory cell corresponding to the converted physical address signal is included.

* * * * *